United States Patent
Beard et al.

(10) Patent No.: US 7,770,096 B1
(45) Date of Patent: Aug. 3, 2010

(54) METHOD OF OPERATING A MATRIX CHECKSUM

(75) Inventors: Paul Frank Beard, Milpitas, CA (US); Robert William Eugene Mack, San Jose, CA (US); Mark Tucker Gerrior, Mountain View, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 629 days.

(21) Appl. No.: 11/348,756

(22) Filed: Feb. 7, 2006

Related U.S. Application Data

(60) Provisional application No. 60/651,297, filed on Feb. 9, 2005.

(51) Int. Cl.
*H03M 13/00* (2006.01)
*G06F 11/10* (2006.01)

(52) U.S. Cl. .................. 714/807; 714/804
(58) Field of Classification Search .............. 714/807, 714/52, 758, 760, 777, 800, 804
See application file for complete search history.

(56) References Cited

U.S. PATENT DOCUMENTS

| | | | | | |
|---|---|---|---|---|---|
| 5,170,400 | A | * | 12/1992 | Dotson | 714/755 |
| 6,981,175 | B2 | * | 12/2005 | Vollrath et al. | 714/7 |
| 7,206,994 | B2 | * | 4/2007 | D'Arcy et al. | 714/807 |
| 7,339,917 | B2 | * | 3/2008 | Newberg et al. | 370/345 |

* cited by examiner

*Primary Examiner*—Sam Rizk

(57) ABSTRACT

A method of operating a matrix checksum includes the steps of determining a column checksum for the data bytes in an information packet. A row checksum for the data bytes in an information packet is determined. The information packet including the column checksum and the row checksum is transmitted.

17 Claims, 5 Drawing Sheets

FIG. 1
(RELATED ART)

| Data Byte 1 | 0 | 0 | 1 | 1 | 0 | 0 | 1 | 1 |
| --- | --- | --- | --- | --- | --- | --- | --- | --- |
| Data Byte 2 | 1 | 1 | 1 | 1 | 0 | 0 | 0 | 0 |
| Column xor checksum | 1 | 1 | 0 | 0 | 0 | 0 | 1 | 1 |

FIG. 2

|  | Bit 8 | Bit 7 | Bit 6 | Bit 5 | Bit 4 | Bit 3 | Bit 2 | Bit 1 |
| --- | --- | --- | --- | --- | --- | --- | --- | --- |
| Bits corrected using xor bits |  | ? |  | 1 |  | 0 |  | 0 |
| Data Byte 1 | 0 | ? | 1 | ? | 0 | ? | 1 | 1 |
| Valid Byte 1 | 1 | 0 | 1 | 0 | 1 | 0 | 1 | 1 |
| Data Byte 2 | 1 | ? | 1 | 1 | 0 | 0 | 0 | ? |
| Valid Byte 2 | 1 | 0 | 1 | 1 | 1 | 1 | 1 | 0 |
| Column xor checksum | 1 | 1 | 0 | 0 | 0 | 0 | 1 | 1 |
| Column Valid | 1 | 1 | 1 | 1 | 1 | 1 | 1 | 1 |

FIG. 3

|  | Bit 8 | Bit 7 | Bit 6 | Bit 5 | Bit 4 | Bit 3 | Bit 2 | Bit 1 |
| --- | --- | --- | --- | --- | --- | --- | --- | --- |
| Bits corrected using xor bits |  | 0,1 |  | 1 |  | 0 |  | 0 |
| Data Byte 1 | 0 | ? | 1 | ? | 0 | ? | 1 | 1 |
| Valid Byte 1 | 1 | 0 | 1 | 0 | 1 | 0 | 1 | 1 |
| Data Byte 2 | 1 | ? | 1 | 1 | 0 | 0 | 0 | ? |
| Valid Byte 2 | 1 | 0 | 1 | 1 | 1 | 1 | 1 | 0 |
| Column xor checksum | 1 | 1 | 0 | 0 | 0 | 0 | 1 | 1 |
| Column Valid | 1 | 1 | 1 | 1 | 1 | 1 | 1 | 1 |
| Row xor checksum | 0 | 0 | 0 | 0 | 0 | 0 | 0 | 0 |
| Row Valid | 1 | 1 | 1 | 1 | 1 | 1 | 1 | 1 |

|  | Bit 8 | Bit 7 | Bit 6 | Bit 5 | Bit 4 | Bit 3 | Bit 2 | Bit 1 |
|---|---|---|---|---|---|---|---|---|
| Byte 1 | x | x | x | x | x | x | x | x |
| Byte 2 | x | | | | | | | |
| Byte 3 | x | | | | | | | |
| Byte 4 | x | | | | | | | |
| Byte 5 | x | | | | | | | |
| Byte 6 | x | | | | | | | |
| Byte 7 | x | | | | | | | |
| Byte 8 | x | | | | | | | |

|  | Bit 8 | Bit 7 | Bit 6 | Bit 5 | Bit 4 | Bit 3 | Bit 2 | Bit 1 |
|---|---|---|---|---|---|---|---|---|
| Byte 1 | x | x | | | | | | |
| Byte 2 | | x | x | | | | | |
| Byte 3 | | | x | x | | | | |
| Byte 4 | | | | x | x | | | |
| Byte 5 | | | | | x | x | | |
| Byte 6 | | | | | | x | x | |
| Byte 7 | | | | | | | x | x |
| Byte 8 | | | | | | | | x |

|  | Bit 8 | Bit 7 | Bit 6 | Bit 5 | Bit 4 | Bit 3 | Bit 2 | Bit 1 |
|---|---|---|---|---|---|---|---|---|
| Byte 1 | x | x | | | | | | |
| Byte 2 | x | x | | | | | | |
| Byte 3 | | | | | | | | |
| Byte 4 | | | | | | | | |
| Byte 5 | | | | | | | | |
| Byte 6 | | | | | | | | |
| Byte 7 | | | | | | | | |
| Byte 8 | | | | | | | | |

FIG. 7

Encode
-Give an array of bytes
-loop through each bit in a byte, position
{
       -loop through each byte in the array, thisByte
       {
       xor checksum bit position of this Byte with column checksum byte and store it into the column checksum byte
       }
}
-Sequence through each bit, position
  {
     -Loop (num of total bits/8), count
     {
       xor checksum bit of position with row checksum byte and store it into the row checksum byte
     }
}
-Append the column and row checksum byte to the end of the array of bytes and transmit.

FIG. 8

Decode
{
    -Loop (num of total bits/8), count (this will correct via row xor checksum)
    -if all the bits are valid continue
    -if more than 2 bits are invalid continue
    -if one bit is invalid correct it (this will correct via Column xor Checksum)
-loop through each bit in the valid byte, position

{

-loop through each byte in the valid array, thisByte
        {}

-if all the bits are valid continue
-if more than 2 bits are invalid continue
-if one bit is invalid correct it
}

} repeat until all bits have been corrected or if both the column and row xor checksum cannot any more bits.

METHOD OF OPERATING A MATRIX CHECKSUM

RELATED APPLICATIONS

The present invention claims priority on provisional patent application, Ser. No. 60/651,297, filed on Feb. 9, 2005, entitled "Matrix XOR Sum" and is hereby incorporated by reference.

FIELD OF THE INVENTION

The present invention relates generally to the field of communications and more particularly to a method of operating a matrix checksum.

BACKGROUND OF THE INVENTION

FIG. 1A is a diagram of a conventional wireless system 1. A transmitter 2 transmits packets to a radio 4 via a wireless channel 6.

There are inherent risks in transmitting data wirelessly. Bits in packets can be lost due to interference even in the best of configurations. One challenge for designers of wireless systems is how to recover packets with a few bad bits without having to re-transmit the entire packet. This problem is applicable to all communication applications in which a determination can be made whether a bit is valid or not.

A conventional solution to this problem is a radio 4 that determines which bits in a given received packet are valid, and an XOR (eXclusive OR) Checksum algorithm. The XOR checksum may then be used to correct invalid data bits. Commonly a byte at the end of packet is included that contains a 'Column XOR Checksum'. The transmitter 2 computes this value by XORing all the same hits in each byte of the packet and putting the result as the last byte in the packet. After the packet has been transmitted, the receiver (radio) 4 checks for invalid bits. If an invalid bit is found, it can be corrected based on the Column XOR checksum.

FIG. 1 shows a conventional solution transmit side packet. The transmitted packet of this example has two bytes of data, and a checksum byte corresponding to the columns of data transmitted. FIG. 2 shows a conventional solution Receive side packet. This is the same packet that was transmitted in FIG. 1, but it has undergone processing on the receive side. The top row of FIG. 2 shows the bits corrected by the XOR error correction. The valid bit rows of FIG. 2 show where data bits may be suspect, due to corruption during transmission. There is a one to one correlation between the valid bits and the data bits.

FIG. 2 shows an example of packet received over the air by the radio with errors. Because Valid Byte 2, Bit 1 is 0 we know the radio could not determine whether Data Byte 2, bit 1 was a 1 or 0. By XORing the remaining bits (Data Byte 1, Bit 1; column XOR checksum, Bit 1) we can reconstruct the missing bit. Because there are two invalid bits in column 7 we are unable to correct this packet. The disadvantage of the conventional system is that it cannot correct for multiple bit erasures in the same column.

It would be desirable to have a solution that is more robust and can correct for multiple bit erasures in the same column.

SUMMARY OF INVENTION

In one embodiment, a method of operating a matrix checksum includes the steps of determining a column checksum for the data bytes in an information packet. A row checksum for the data bytes in an information packet is determined. The information packet including the column checksum and the row checksum is transmitted. The information packet may then be received. When a bit in one of the data bytes cannot be determined, the row checksum for the bit is exclusive ORed with the bits in the row of the invalid bit to determine a bit value.

In one embodiment, the information packet is transmitted over a wireless channel 6. The information packet is received. Next it is determined if no more than a single bit error has occurred in any row or column of a data matrix made up of the data bytes. When no more than the single bit error has occurred in the single row or the single column of the data matrix, a correct bit value for the bit error is determined. Next it is determining if no more than a single bit error exists, after the corrected bit is inserted into the data matrix, in a single row or a single column of the data matrix. Any single bit errors are corrected.

In one embodiment, a method of operating a matrix checksum including the steps of receiving an information packet containing a row checksum and a column checksum. Next it is determined if a single error has occurred in any single row or single column of a data matrix. When the single error has occurred in any single row or single column of the data matrix, a corrected bit is determined using either an associated row checksum or an associated column row checksum. The corrected bit is inserted in the data matrix to form a first corrected data matrix. Next, it is determining if a single error has occurred in any single row or single column of the first corrected data matrix. When the single error has occurred in any single row or single column of the first corrected data matrix, a corrected bit is determined using the either an associated row checksum or an associated column row checksum. When more than the single error has occurred in all rows and columns of the first corrected data matrix, determining that the more than the single error cannot be corrected. The row checksum and the column checksum for the information packet may be calculated. The information packet may be transmitted over a wireless channel.

In one embodiment, a method of operating a matrix checksum, includes the steps of determining a row checksum for a data matrix. An information packet containing the row checksum and the data matrix is transmitted. A column checksum for the data matrix may be calculated. The information packet is received including the row checksum and a column checksum. Next it is determined if a single error has occurred in any single row or single column of the data matrix. When the single error has occurred in any single row or single column of the first corrected data matrix, a corrected bit is determined using the either an associated row checksum or an associated column row checksum. The corrected bit is inserted in the data matrix to form a first corrected data matrix. Next it is determined if a single error has occurred in any single row or single column of the first corrected data matrix. When the single error has occurred in any single row or single column of the first corrected data matrix, a corrected bit is determined using the either an associated row checksum or an associated column row checksum.

BRIEF DESCRIPTION OF THE DRAWINGS

FIG. 1 is a diagram of the conventional solution Transmit side packet.

FIG. 2 is a diagram of the conventional solution Receive side packet.

FIG. 3 is a diagram of the improved solution packet for error correction in wireless systems.

FIG. 4 illustrates an error scenario with a simple execution solution.

FIG. 5 illustrates an error scenario with a worst-case execution solution.

FIG. 6 illustrates an error scenario with a deadlock that cannot be solved using either the improved or the conventional solution.

FIG. 7 is a pseudo-code listing describing the encode operation of this invention.

FIG. 8 is a pseudo-code listing describing the decode operation of this invention.

DETAILED DESCRIPTION OF THE DRAWINGS

Figure 1A:
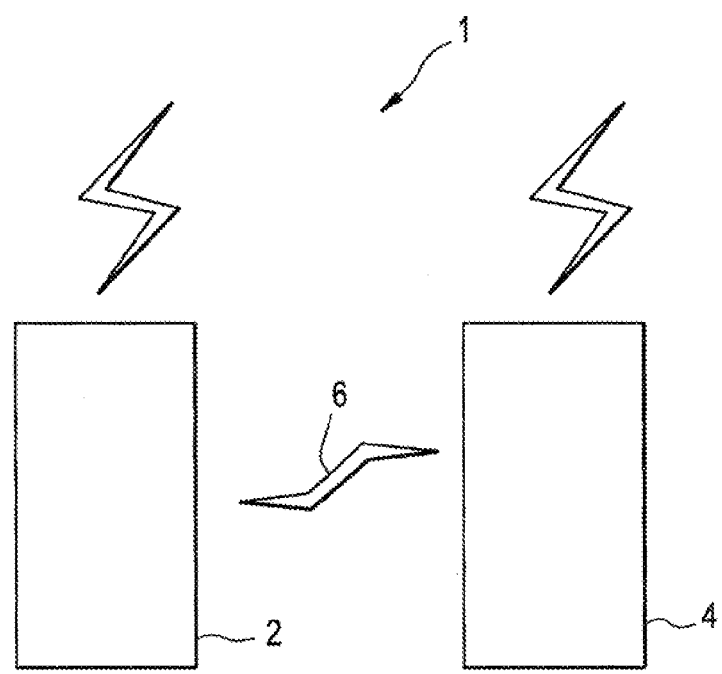
FIG. 1A is a diagram of a conventional wireless system 1.

The present application is related to a method of error correction. The method uses both a column checksum and a row checksum to determine the value of data bits that are determined by a receiver to be invalid. Note that bit errors and invalid bits are used interchangeably in this specification. By having both a row and a column checksum substantially more bit errors may be corrected.

FIG. 3 is a diagram of the improved solution 10 packet for error correction in wireless systems. The figure shows that bits 7, 5 & 3 are invalid for data byte one 12 and bits 7 & 1 are invalid for data byte two 14. Note that valid data byte one row 16 is a one when the data is valid and a zero when the data is invalid and this is the same for the valid data byte two row 18. Note that there are two errors in the bit 7 column. A conventional checksum system could not resolve this situation. In this case, it is possible to resolve these invalid bits. First we determine the valid data for bits 5 & 3 of byte one. For bit 5 the valid data value is (data byte 2, bit 5 XOR with the associated column checksum, 1 XOR 0=1) one. Note that this is the value shown in row 20 (bits corrected using XOR bits) bit 5. Next we correct bit 3 of byte one (0 XOR 0=0). We can also correct bit 1 of byte two (1 XOR 1=0). Using these corrected bits and the row checksums we can correct bit 7 for bytes one and two. Note that there are just two row checksums, one for byte one and one for byte two. If you XOR all the bits of data byte one you will get an answer of zero and similarly for data byte two. If you XOR all the data bit in row one 12 of the corrected data matrix (0, 1, 1, 0, 0, 1, 1, 0) and the associated row checksum value (0) you will find that the data value for bit seven of byte one is zero. Similarly if you XOR all the data bits in row two 14 of the corrected data matrix (1, 1, 1, 0, 0, 0, 0) and the associated row checksum value (0) you will find that the data value for bit seven of byte two is one. Thus we are able to correct the two invalid bits in a single column using the row checksums.

FIG. 4 illustrates an error scenario 30 with a simple execution solution. The invalid data bits are represented by the "X" in the boxes of the data matrix. In this case the column bit sums can be used to resolve the bit values for bits 7-1 of byte one 32. The row checksums can be used to resolve all the bit eight values, since there is only a single invalid bit of data in each row of the corrected data matrix.

FIG. 5 illustrates an error scenario 40 with a worst-case execution solution. In this case only a single column has only one error. Note that none of the rows have a single error. Using the column checksum for bit eight, the value for bit eight of byte one is determined. Next the row checksum for byte one can be used with the corrected data matrix to determine the value of bit seven of byte one. Next bit seven of byte two can be resolved using the column checksum for bit seven and the corrected data matrix. This process then can be used to correct all the invalid data bits represented by the "X" in the boxes.

FIG. 6 illustrates an error scenario 50 with a deadlock that cannot be solved using either the improved or the conventional solution. In this case there is no row or column with an invalid data bit that has less than two errors. As a result, the error cannot be resolved. In order to resolve any errors there must be at least one row or one column with only one bit of invalid data. However, this method is able to resolve many more errors than conventional methods that only use a column checksum.

For illustration purposes only, FIG. 7 shows pseudo-code listing describing the encode operation of this invention and FIG. 8 shows pseudo-code listing describing the decode operation of this invention.

Thus there has been described a method of operating a matrix checksum that is more robust and can correct for multiple bit erasures in the same column.

The methods described herein can be implemented as computer-readable instructions stored on a computer-readable storage medium that when executed by a computer will perform the methods described herein.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. A method, comprising:
   receiving an information packet that includes a row checksum and a column checksum;
   determining whether more than one error has occurred in a single row or whether more than one error has occurred in a single column of the information packet;
   correcting a first bit associated with the more than one error with the row checksum or the column checksum; and,
   correcting a second bit associated with the more than one error using a different checksum than was used to correct the first bit, the second bit being located in a same row or a same column as the first bit.

2. The method of claim 1, further comprising inserting the corrected first bit and the corrected second bit into the information packet.

3. The method of claim 1, wherein the receiving an information packet comprises receiving the information packet over a wireless communication system.

4. The method of claim 1, wherein the correcting a first bit is performed with an exclusive OR checksum algorithm.

5. The method of claim 1, wherein the more than one error is in a single row of the information packet and the column checksum is used to correct the first bit.

6. The method of claim 1, wherein the more than one error is in a single column of the information packet and the row checksum is used to correct the first bit.

7. The method of claim 1, wherein the row checksum and the column checksum are part of a solution packet contained in the information packet.

8. A computer-readable storage medium comprising computer readable instructions, that when executed by a computing device, cause the computing device to perform a method comprising:
   determining whether more than one data error has occurred in a single row or a single column of a data packet that includes a row checksum and a column checksum;

in an instance where the more than one data error is in a single row then correcting a first bit associated with the more than one data error with the column checksum; and, correcting a second bit associated with the more than one data error using a different checksum than the first bit.

9. The computer-readable storage medium of claim 8, further comprising receiving the data packet wirelessly.

10. The computer-readable storage medium of claim 8, wherein the correcting a first bit is performed with an exclusive OR checksum algorithm.

11. The computer-readable storage medium of claim 8, wherein, in an instance that the more than one data error is in a single column of the data packet, using a row checksum to correct the first bit.

12. The computer-readable storage medium of claim 8, wherein the more than one data error is in a single row of the data packet and the column checksum is used to correct the first bit and a second bit.

13. A computer-readable storage medium comprising computer readable instructions, that when executed by a computer processor, cause the computer processor to perform a method comprising:

determining whether first and second errors occurred in a single column of an information packet that includes a row checksum and a column checksum; and, correcting a first bit associated with the first error with the row checksum, and correcting a second bit associated with the second error using a different checksum than was used to correct the first bit.

14. The computer-readable storage medium of claim 13, wherein the receiving an information packet comprises receiving the information packet wirelessly.

15. The computer-readable storage medium of claim 13, wherein the correcting a first bit is performed using an exclusive OR checksum algorithm.

16. The computer-readable storage medium of claim 13, wherein the first and second errors are in the same row of the information packet and the column checksum is used to correct the first bit.

17. The computer-readable storage medium of claim 13, wherein the first and second errors are in the same column of the information packet and the row checksum is used to correct the first bit.

* * * * *